(12) United States Patent
Wang

(10) Patent No.: US 10,534,267 B2
(45) Date of Patent: Jan. 14, 2020

(54) LITHOGRAPHY PATTERNING WITH FLEXIBLE SOLUTION ADJUSTMENT

(71) Applicant: Taiwan Semiconductor Manufacturing Company, Ltd., Hsin-Chu (TW)

(72) Inventor: Chung-Cheng Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/049,208

(22) Filed: Jul. 30, 2018

(65) Prior Publication Data

US 2018/0335699 A1  Nov. 22, 2018

Related U.S. Application Data

(62) Division of application No. 15/061,812, filed on Mar. 4, 2016.

(51) Int. Cl.
*G03D 5/00* (2006.01)
*G03F 7/32* (2006.01)
*G03F 7/30* (2006.01)
*G03F 7/20* (2006.01)
*G03F 7/40* (2006.01)

(52) U.S. Cl.
CPC .......... *G03F 7/32* (2013.01); *G03F 7/20* (2013.01); *G03F 7/3071* (2013.01); *G03F 7/322* (2013.01); *G03F 7/325* (2013.01); *G03F 7/40* (2013.01)

(58) Field of Classification Search
USPC ................................................ 396/611
See application file for complete search history.

(56) References Cited

U.S. PATENT DOCUMENTS

| 6,634,806 | B2 * | 10/2003 | Toshima | G03F 7/3021 134/902 |
|---|---|---|---|---|
| 6,872,014 | B1 * | 3/2005 | Paxton | G03F 7/3021 118/52 |
| 9,459,536 | B1 | 10/2016 | Lai et al. | |
| 9,580,672 | B2 * | 2/2017 | Liu | C11D 11/0041 |
| 9,612,536 | B2 | 4/2017 | Liu et al. | |
| 9,645,497 | B2 | 5/2017 | Chang et al. | |

(Continued)

FOREIGN PATENT DOCUMENTS

| JP | 2013038423 | 2/2013 |
|---|---|---|
| KR | 19980045171 | 9/1998 |

(Continued)

*Primary Examiner* — Rodney E Fuller
(74) *Attorney, Agent, or Firm* — Haynes and Boone, LLP

(57) ABSTRACT

A system for lithography patterning includes a first supply pipe for supplying a first solution; a second supply pipe for supplying a second solution; a third supply pipe coupled to the first and second supply pipes for receiving the first and second solutions respectively and mixing the first and second solutions into a mixture; a substrate stage for holding a substrate; a supply nozzle coupled to the third supply pipe for dispensing the mixture to the substrate; a first control unit coupled to the first supply pipe and configured to control a flow rate of the first solution going to the third supply pipe; and a second control unit coupled to the second supply pipe and configured to control a flow rate of the second solution going to the third supply pipe.

20 Claims, 16 Drawing Sheets

(56) References Cited

U.S. PATENT DOCUMENTS

| | | | |
|---|---|---|---|
| 2002/0052100 A1 | 5/2002 | Tanaka et al. | |
| 2003/0017403 A1* | 1/2003 | Kokubo | B05D 1/265 430/7 |
| 2003/0044731 A1* | 3/2003 | Yoshihara | G03D 3/06 430/325 |
| 2007/0183775 A1* | 8/2007 | Mitsuhashi | G03F 7/3021 396/611 |
| 2007/0184178 A1* | 8/2007 | Yamamoto | G03F 7/3021 427/8 |
| 2007/0266936 A1* | 11/2007 | Shiobara | H01L 21/67051 118/53 |
| 2008/0274433 A1 | 11/2008 | Takaki et al. | |
| 2010/0209852 A1* | 8/2010 | Yeh | G03F 7/16 430/311 |
| 2010/0330508 A1 | 12/2010 | Ookouchi et al. | |
| 2011/0159447 A1* | 6/2011 | Kumagai | B01F 3/088 430/331 |
| 2013/0040246 A1 | 2/2013 | Kawakami | |
| 2014/0065554 A1* | 3/2014 | Liu | G03F 7/322 430/319 |
| 2014/0255851 A1 | 9/2014 | Wang et al. | |
| 2014/0273472 A1* | 9/2014 | Somervell | H01L 21/31144 438/702 |
| 2015/0128995 A1* | 5/2015 | Kaneko | B08B 7/0014 134/4 |
| 2018/0173096 A1* | 6/2018 | Zi | G03F 7/325 |
| 2019/0086818 A1* | 3/2019 | Zi | G03F 7/168 |

FOREIGN PATENT DOCUMENTS

| | | |
|---|---|---|
| KR | 2003019138 | 3/2003 |
| KR | 20110040659 | 4/2011 |

* cited by examiner

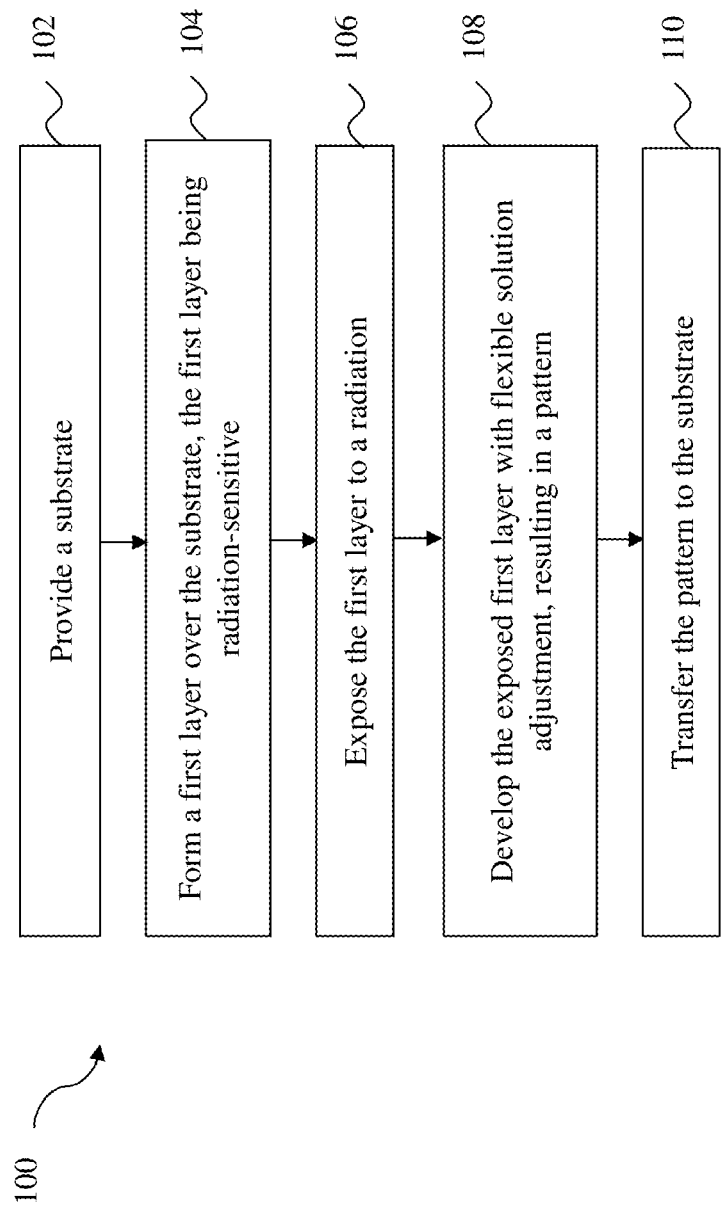

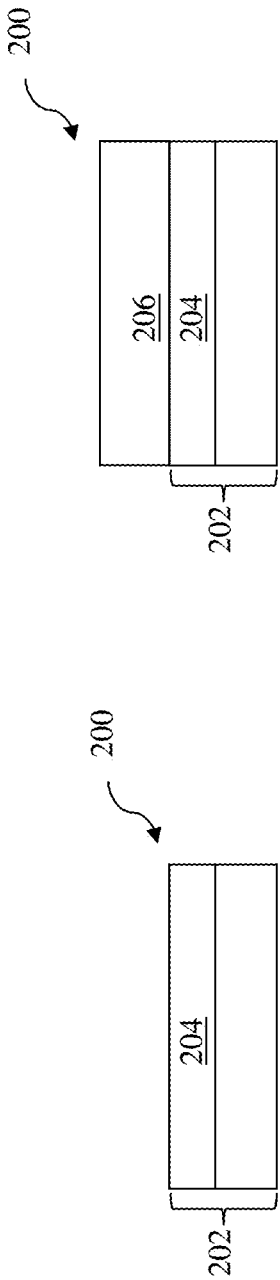
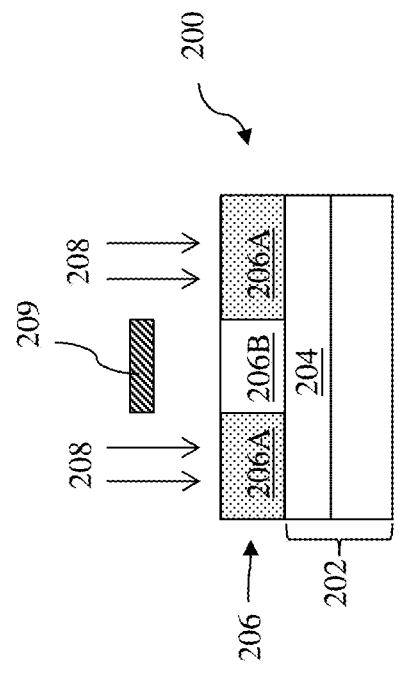
FIG. 2A
FIG. 2B
FIG. 2C

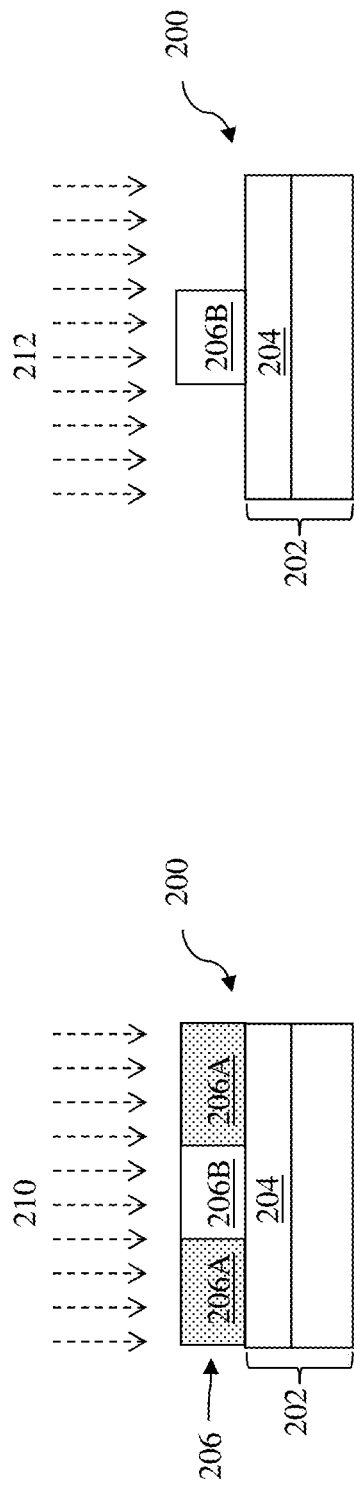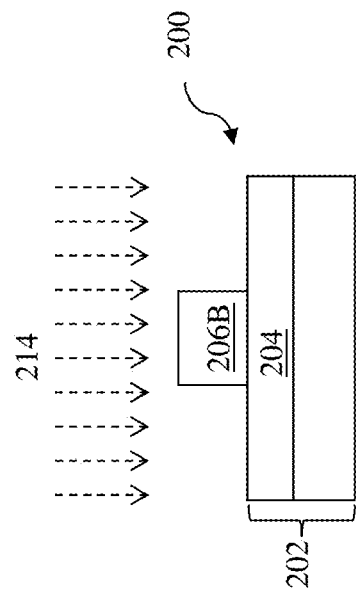

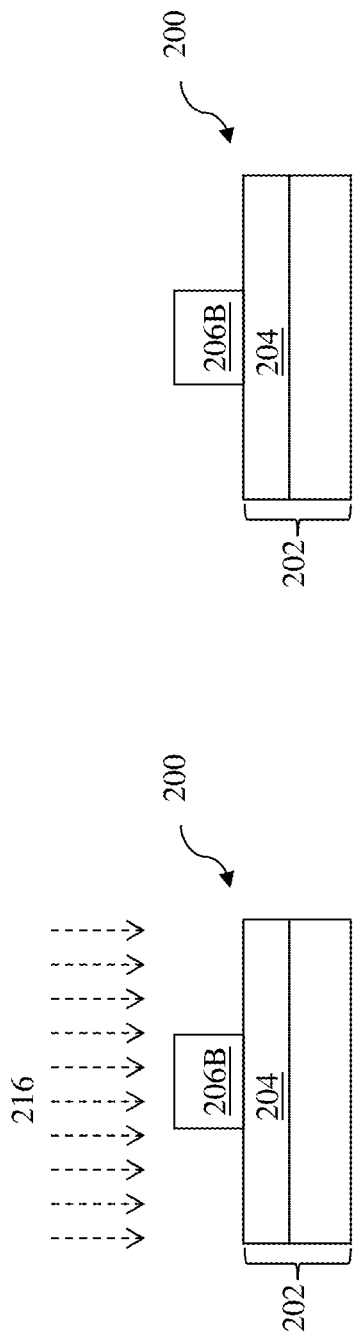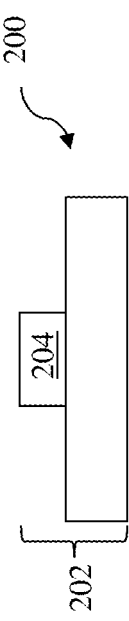

LITHOGRAPHY PATTERNING WITH FLEXIBLE SOLUTION ADJUSTMENT

PRIORITY

This is a divisional of U.S. patent application Ser. No. 15/061,812, filed Mar. 4, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, lithography has been the traditional method for transferring IC patterns to semiconductor wafers. In a typical lithography process, a resist film is coated on a surface of a wafer and is subsequently exposed and developed to form a resist pattern. The resist pattern is then used for etching the wafer to form an IC. The quality of the resist pattern directly impacts the quality of the final IC. The measures of the quality of a resist pattern include critical dimension variance, line edge roughness (LER), and line width roughness (LWR). As the semiconductor scaling down process continues, it is desirable to improve the existing developing processes and systems so as to reduce critical dimension variance, LER, and LWR of the resist patterns to meet pre-determined critical dimension uniformity (CDU).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a lithography patterning method according to various aspects of the present disclosure.

FIGS. 2A, 2B, 2C, 2D, 2E, 2F, 2G, 2H, and 2I illustrate cross sectional views of forming a target pattern according to the method of FIG. 1, in accordance with an embodiment.

DETAILED DESCRIPTION

Figure 3:
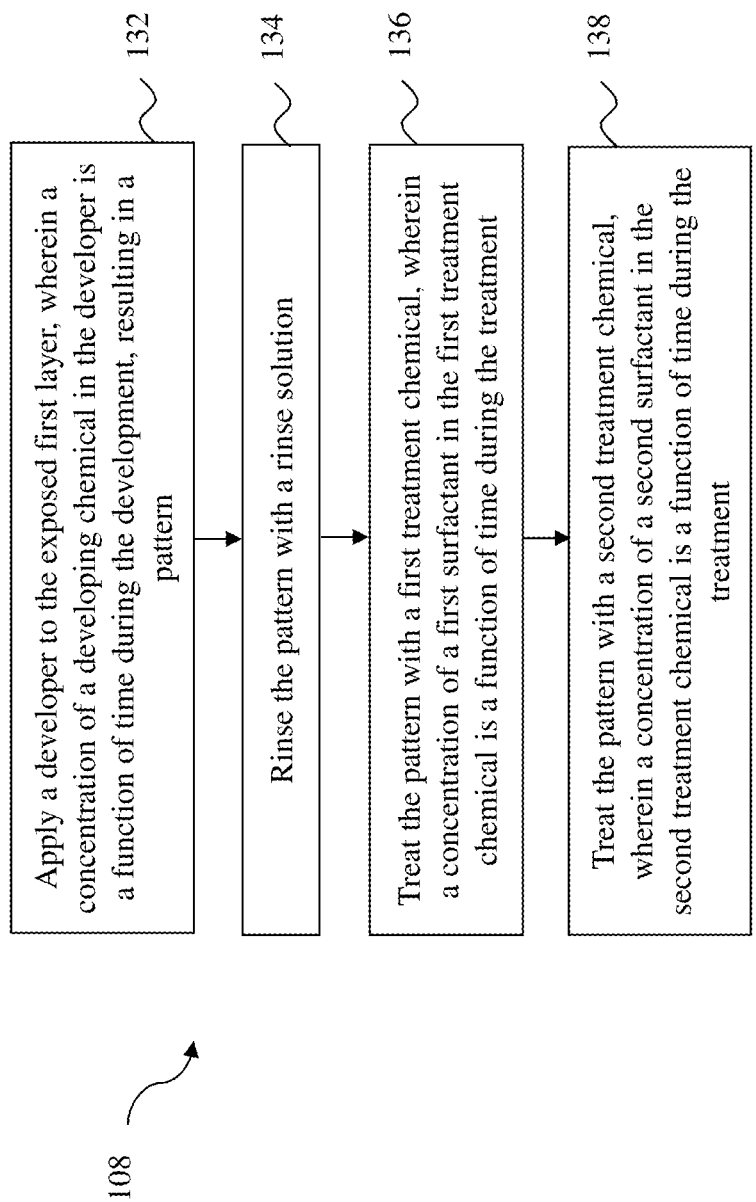
FIG. 3 illustrates a flow chart of a resist developing process with flexible solution adjustment, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to methods for semiconductor device fabrication, and more particularly to methods of lithography patterning. In lithography patterning, after a resist film is exposed, it is developed in a developer. The developer removes portions of the resist film, thereby forming a resist pattern which may include line patterns and/or trench patterns. The resist pattern may undergo additional rinsing and treatment processes to be further solidified. The resist pattern is used as an etch mask in subsequent etching processes, transferring the pattern to underlying patterning layers. The lines and/or trenches of a resist pattern usually exhibit non-uniform critical dimensions (CD) across a substrate (e.g., a wafer) due to various factors. Such CD non-uniformity in a resist pattern may lead to manufacturing defects and should be avoided whenever possible. This is particularly true in nanometer (nm) fabrication regimes. The present disclosure provides methods and systems for developing resist patterns with improved CD uniformity.

FIG. 1 is a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, and other appropriate lithography processes to improve pattern dimension accuracy. Additional operations can be provided before, during, and after the method 100, and some operations described can be replaced, eliminated, or relocated for additional embodiments of the method. The method 100 is an example, and is not intended to limit the present disclosure beyond what is explicitly recited in the claims. The method 100 is described below in conjunction with FIGS. 2A-2I wherein a semiconductor device 200 is fabricated by using embodiments of the method 100. The semiconductor device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 (FIG. 1) is provided with a substrate 202 (FIG. 2A) at operation 102. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium; a compound semiconductor such as silicon carbide, gallium arsenide, indium arsenide, and indium phosphide; an alloy semiconductor such as GaAsP, AlInAs, AlGaAs, InGaAs, GaInP, and/or GaInAsP; or combinations thereof. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In the present embodiment, the substrate 202 includes a patterning layer 204. In an embodiment, the patterning layer 204 is a hard mask layer including material(s) such as amorphous silicon (a-Si), silicon oxide, silicon nitride (SiN), titanium nitride, or other suitable material or composition. In an embodiment, the patterning layer 204 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the patterning layer 204 may include a high-k dielectric layer, a gate layer, a hard mask layer, an interfacial layer, a capping layer, a diffusion/barrier layer, a dielectric layer, a conductive layer, other suitable layers, and/or combinations thereof. In another embodiment, the substrate 202 is a mask substrate that may include a low thermal expansion material such as quartz, silicon, silicon carbide, or silicon oxide-titanium oxide compound. To further this example, the substrate 202 may be a mask substrate for making a deep ultraviolet (DUV) mask, an extreme ultraviolet (EUV) mask, or other types of masks.

The method 100 (FIG. 1) proceeds to operations 104 by forming a layer 206 over the substrate 202 (FIG. 2B). The layer 206 includes a radiation-sensitive material. Referring to FIG. 2B, in an embodiment, the layer 206 is formed by spin-on coating a liquid polymeric material onto the substrate 202, followed by a soft baking process and a hard baking process. In an embodiment, the layer 206 is a photoresist such as an I-line resist, a DUV resist including a krypton fluoride (KrF) resist and argon fluoride (ArF) resist, a EUV resist, an electron beam (e-beam) resist, and an ion beam resist. For convenience, the layer 206 is simply referred to as the resist 206 in the following discussion. In various embodiments, the resist 206 may be a positive resist or a negative resist. A positive resist is generally insoluble in a developer, but becomes soluble upon radiation. A negative resist has the opposite behavior: it is generally soluble in a developer, but becomes insoluble upon radiation.

The method 100 (FIG. 1) proceeds to operation 106 by exposing the resist 206 to a radiation 208 in a lithography system. Referring to FIG. 2C, the radiation 208 may be an I-line (365 nm), a DUV radiation such as KrF excimer laser (248 nm) or ArF excimer laser (193 nm), a EUV radiation (e.g., 13.8 nm), an e-beam, an x-ray, an ion beam, or other suitable radiations. Operation 106 may be performed in air, in a liquid (immersion lithography), or in a vacuum (e.g., for EUV lithography and e-beam lithography). In an embodiment, the radiation 208 is patterned with a mask (not shown), such as a transmissive mask or a reflective mask, which may include resolution enhancement techniques such as phase-shifting and/or optical proximity correction (OPC). In another embodiment, the radiation 208 is directly modulated with a predefined pattern, such as an IC layout, without using a mask (maskless lithography). In the present embodiment, the radiation 208 exposes portions 206A of the resist 206 according to a pattern 209, either with a mask or maskless. In the present embodiment, the resist 206 is a positive resist and the irradiated portions 206A become soluble in a developer. In an alternative embodiment, the resist 206 is a negative resist and the irradiated portions 206A become insoluble in a developer. The semiconductor device 200 may be subjected to additional processes, such as a post-exposure baking process.

The method 100 (FIG. 1) proceeds to operation 108 by developing the exposed resist 206 with a flexible solution adjustment process, constructed according to various aspects of the present disclosure. In an embodiment, the operation 108 includes one or more processes such as developing (FIG. 2D), rinsing (FIG. 2E), and treatment processes (FIGS. 2F and 2G), which will be further discussed below. The irradiated portions 206A are removed in the operation 108, resulting in a resist pattern 206B (FIG. 2H). In the example as shown in FIG. 2H, the resist pattern 206B is represented by a line pattern. However, the following discussion is equally applicable to resist patterns represented by trenches. At operation 110, the method 100 transfers the pattern from the resist pattern 206B to the substrate 202, which will be further discussed below.

As discussed above, the quality of the resist pattern 206B directly impacts the quality of the final fabricated IC. Among various measures of the quality of the resist pattern 206B is the critical dimension variance, e.g., a 3σ deviation of a minimum pattern dimension. Other measures include line width roughness (LWR) and/or line edge roughness (LER). Some developing processes may lead to non-uniform CDs across a wafer. For example, CDs in or near the center of a wafer may be larger than the CDs in outer areas of the wafer. In one example with a 300-nm wafer, the CDs of a EUV resist pattern could vary in excess of 3 nm from the center of the wafer to its perimeter in some instances. Such excessive CD variance may be unacceptable to certain production lines. The inventor of the present disclosure observed that one factor leading to such excessive CD variance is how the developer 210's chemical concentration is controlled during the developing of the resist 206. In a typical developing process, a developer's chemical concentration remains about constant throughout the developing process. The developer is dispensed at the center of a wafer and flows to the rest areas of the wafer due to centrifugal force generated by spinning of the wafer. As a result, not all areas of the wafer receive the same amount of the developer and the center of the wafer is over-developed compared to the outer areas of the wafer. The present disclosure addresses such issues with a flexible solution adjustment scheme where the chemical concentration of the developer 210 is flexibly adjusted as a function of time. In one example, the developer 210 starts with a low chemical concentration. As it flows and fills the entire area of a wafer, its chemical concentration is increased to achieve certain chemical performance. As a result, the entire wafer is developed more evenly, providing better CDU than the typical developing processes. An embodiment of the flexible solution adjustment is shown in FIG. 3.

Referring to FIG. 3, shown therein is an embodiment of the operation 108, implemented with a flexible solution adjustment scheme according to various aspects of the present disclosure. The operation 108 will be discussed collectively with FIGS. 2D-2G. In a brief overview, the operation 108 includes steps 132, 134, 136, and 138. In the step 132, the operation 108 flexibly adjusts a chemical concentration (i.e., as a function of time) in a developer 210 while developing the resist 206 (FIG. 2D) with the developer 210. In the step 134, the operation 108 rinses the resist pattern 206B with a rinse solution 212 (FIG. 2E). In the step 136, the operation 108 flexibly adjusts a chemical concentration in a first treatment chemical 214 while treating the resist pattern 206B (FIG. 2F) with the chemical 214. In the step 138, the operation 108 flexibly adjusts a chemical concentration in a second treatment chemical 216 while treating the resist pattern 206B (FIG. 2G) with the chemical 216. Additional operations can be provided before, during, and after the steps 132-138, and some operations described can be replaced, eliminated, modified, or moved around for additional embodiments of the method. For example, an embodiment of the operation 108 may flexibly adjust the developer 210 in the step 132, but keep the treatment chemicals 214 and/or 216 constant (without flexible adjustment) in the steps 136 and/or 138 respectively. For another example, an embodiment of the operation 108 may include another rinse step (similar to the step 134) between the treatment steps 136 and 138. One of ordinary skill in the art may recognize other examples of semiconductor fabrication processes that may benefit from aspects of the present disclosure.

At the step 132, the operation 108 applies the developer 210 to the exposed resist 206 (FIG. 2D). The developer 210 includes a developing chemical dissolved in a solvent. In one example, the developer 210 is a positive tone developer, e.g., containing tetramethylammonium hydroxide (TMAH) dissolved in an aqueous solution. In another example, the developer 210 is a negative tone developer, e.g., containing n-Butyl Acetate (nBA) dissolved in an organic solvent. A concentration of the developing chemical (e.g., TMAH or nBA) in the developer 210 (or simply "developer concentration") is flexibly adjusted during the developing process as a function of time. In an embodiment, the developer 210 starts with a first developer concentration. After the resist 206 has been developed for a first duration, the developer 210 is changed to have a second developer concentration that is different from the first developer concentration, and the resist 206 is developed for a second duration. In an embodiment, the first developer concentration is lower than the second developer concentration, making the step 132 a "dilute developing" process. Further adjustments of the developer concentration may follow after the second duration, until the resist 206 is fully developed.

Figure 4A:
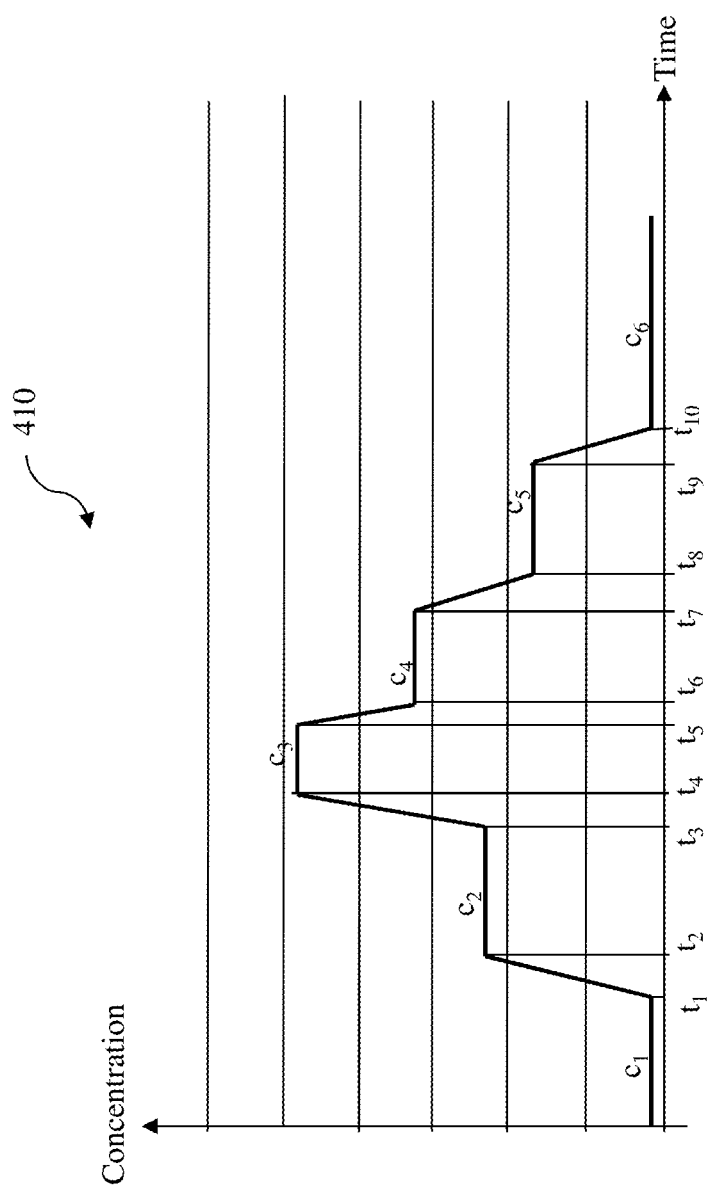
FIGS. 4A and 4B each show a graph of a flexible solution adjustment in a resist developing process, constructed according to aspects of the present disclosure in one or more embodiments.

A graph 410 in FIG. 4A illustrates that the concentration of the developing chemical in the developer 210 is a function of time (i.e., it is not constant, and it may vary over time or during some periods of time) during the step 132, in accordance with an embodiment. Referring to FIG. 4A, the step 132 includes a 6-stage flexible adjustment in the illustrated embodiment. The six stages are labeled as $c_1$, $c_2$, $c_3$, $c_4$, $c_5$, and $c_6$, which are also the values of the developer concentration at the respective stages. Within each stage, the developer concentration remains substantially constant. From one stage to a subsequent (the immediately next) stage, the developer concentration varies. The six concentrations $c_1$, $c_2$, $c_3$, $c_4$, $c_5$, and $c_6$ may be all different, or some of them may be the same. For example, in an embodiment, it may hold true that $c_2 \neq c_3$ and $c_3 \neq c_4$, but $c_2 = c_4$. Further, the graph 410 shown in FIG. 4A is merely an example of the flexible adjustment of the developer 210. The various developer concentrations and developing durations may be modified and/or removed, and additional developer concentrations and developing durations may be added or inserted for additional embodiments. For example, one or more of the steps, $c_2$, $c_3$, $c_4$, and $c_5$, may have duration of zero, which makes the concentration of the developing chemical in the developer 210 varies more continuously than having steps.

Still referring to FIG. 4A, initially, the developer 210 has a concentration $c_1$, which may be low, for example, near 0.0%. The resist 206 may not be actually developed in this initial stage. At time $t_1$, the concentration of the developing chemical in the developer 210 starts to increase linearly and reaches $c_2$ at time $t_2$. The developer concentration remains substantially the same from $t_2$ to $t_3$. At time $t_3$, the developer concentration starts to increase linearly and reaches $c_3$ at time $t_4$. The rates of increase (e.g., % per second) from $c_1$ to $c_2$ and from $c_2$ to $c_3$ may be the same or different. The developer concentration remains substantially the same from $t_4$ to $t_5$. Afterwards, the developer concentration starts to decrease at $t_5$ linearly and reaches $c_4$ at time $t_6$. Similarly, the developer concentration decreases from $t_7$ to $t_8$ and from $t_9$ to $t_{10}$. The rates of decrease (e.g., % per second) in the three periods ($t_5$-$t_6$, $t_7$-$t_8$, and $t_9$-$t_{10}$) may be the same or different. The developer concentration remains substantially the same during the periods $t_6$-$t_7$, $t_8$-$t_9$, and after $t_{10}$, respectively. The developer 210 is being applied to the resist 206 while its concentration is being adjusted according to the graph 410.

Figure 4B:
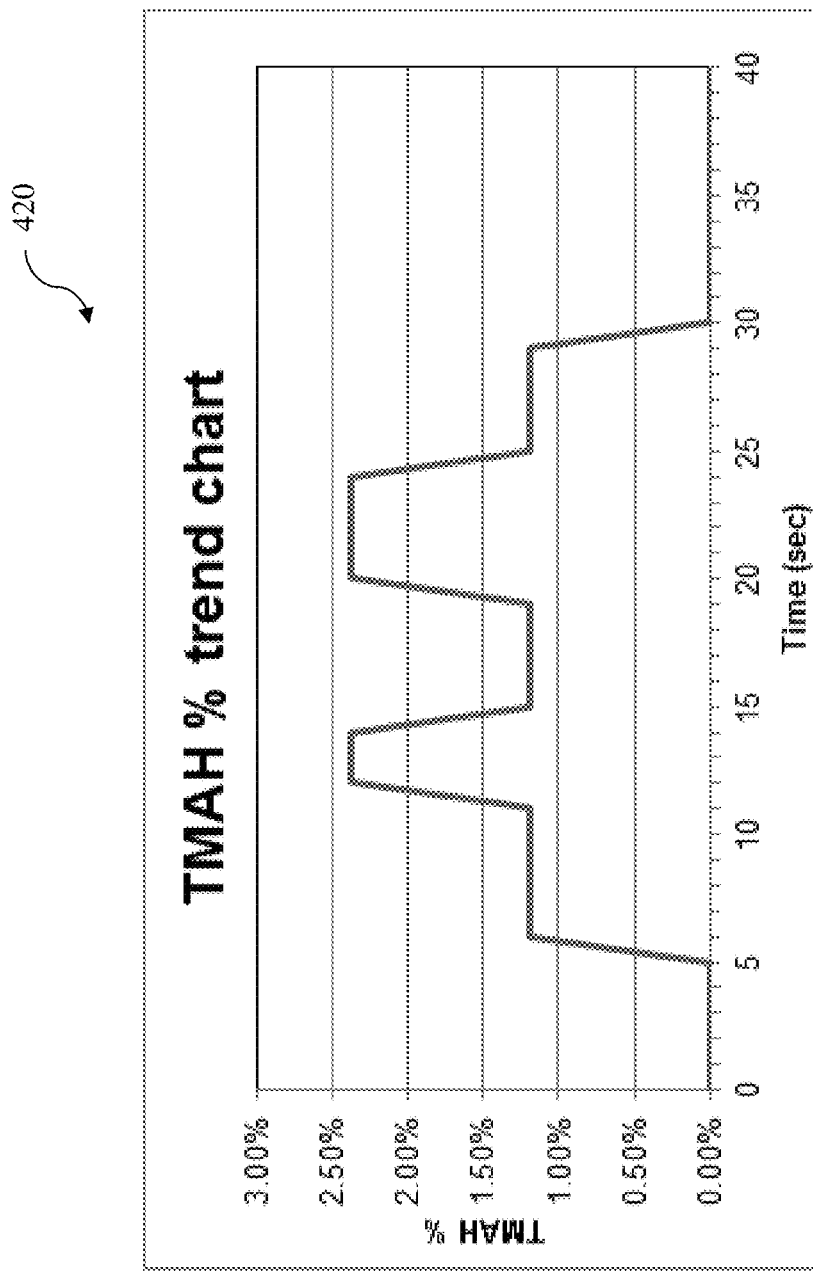

A graph 420 in FIG. 4B illustrates an embodiment of the flexible adjustment of the developer 210 which includes TMAH in an aqueous solution. Referring to FIG. 4B, the developer 210 has an initial TMAH concentration near 0.0%. From Time=5 seconds to Time=6 seconds, the TMAH concentration increases from 0.0% to about 1.2%. The resist 206 is developed with 1.2% TMAH for about 6 seconds. Then, from Time=11 seconds to Time=12 seconds, the TMAH concentration increases from about 1.2% to about 2.38%. The resist 206 is further developed with 2.38% TMAH for about 2 seconds. It is noted that the resist 206 is also being developed while the TMAH concentration is being changed (e.g., during the time periods from Time=5 seconds to Time=6 seconds and from Time=10 seconds to Time=11 seconds). Further adjustments follow, which include decreasing of the TMAH concentration from 2.38% to 1.2% (from Time=14 seconds to Time=15 seconds, and from Time=24 seconds to Time=25 seconds), increasing of the TMAH concentration from 1.2% to 2.38% (Time=19 seconds to Time=20 seconds), and decreasing of the TMAH concentration from 1.2% to near 0.0% (from Time=29 seconds to Time=30 seconds). After Time=30 seconds, the resist 206 has been fully developed, with the irradiated portions 206A dissolved by the developer 210. The step 134 (FIG. 3) may follow, e.g., at Time=36 seconds, to remove any residue, including excessive developer 210, from the device 200.

Figure 5A:
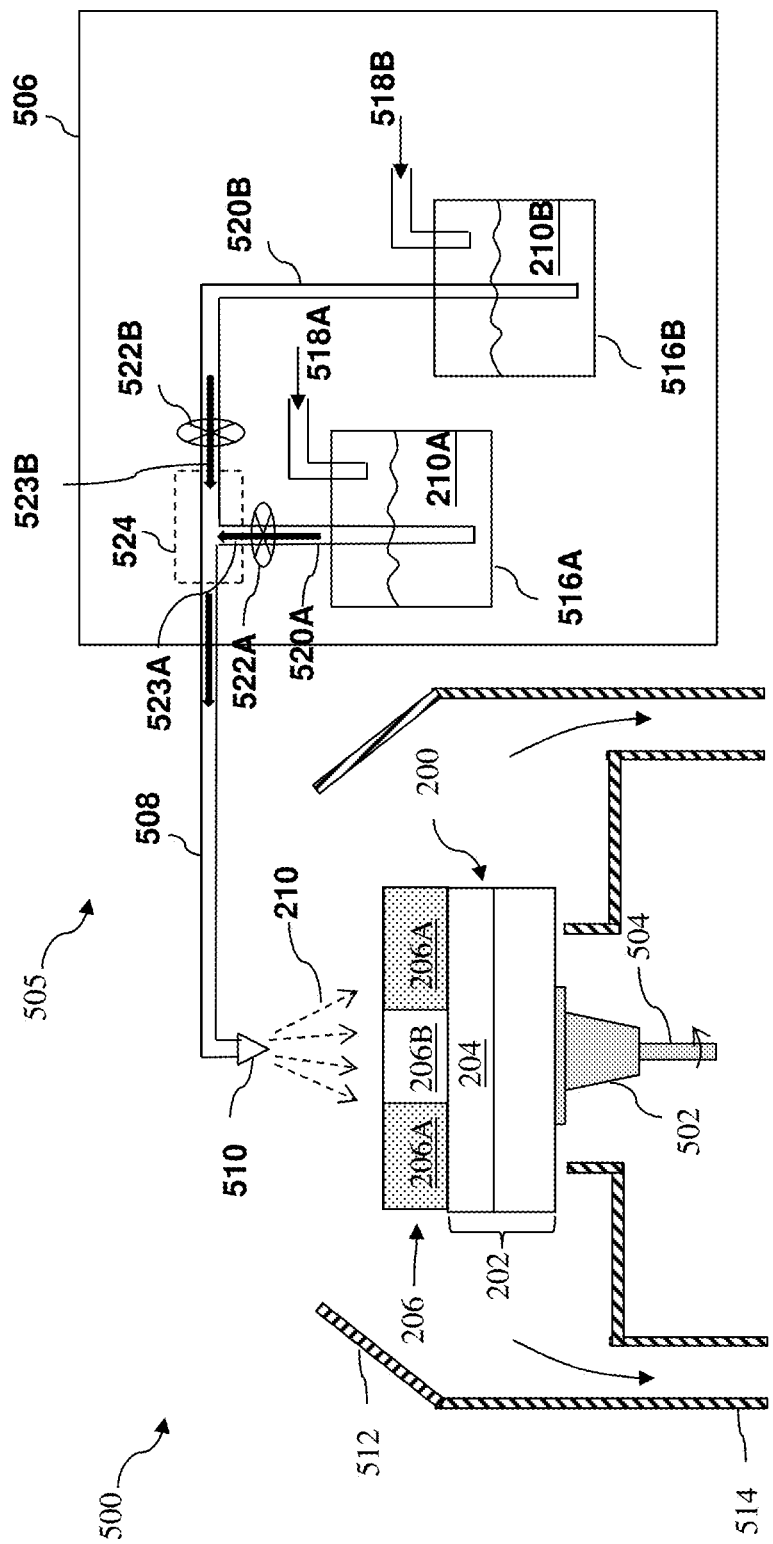
FIG. 5A is a schematic view of a lithography developing apparatus constructed according to aspects of the present disclosure in one or more embodiments.

The step 132 (FIG. 3) may be implemented in a developing system 500, an embodiment of which is shown in FIG. 5A. Referring to FIG. 5A, the system 500 includes a substrate stage 502 designed to retain a substrate, such as the substrate 202. As shown, the substrate 202 is further coated with the resist 206 which has been exposed and is ready to be developed. The substrate stage 502 includes a mechanism, such as vacuum suction mechanism, e-chucking, or other suitable mechanism, to secure the substrate 202. The system 500 further includes a motion mechanism 504 integrated with the substrate stage 502 and is operable to drive the substrate stage 502 and the substrate 202 secured thereon in various motion modes. In some embodiments, the motion mechanism 504 includes a motor to drive the substrate stage 502 and the substrate 202 to spin at a certain spin speed during various operations (such as developing and rinsing). In some embodiments, the motion mechanism 504 includes an elevation module to move the substrate 202 along a vertical direction so that the substrate 202 is able to be positioned at a lower or higher level.

The system 500 further includes a sub-system 505 which applies the developer 210 to the resist 206. The sub-system 505 includes a storage and mixer (or mixer) 506, a supply pipe 508, and a supply nozzle 510 coupled together. The supply nozzle 510 is movably positioned directly above the center of the substrate 202. The developer 210 is dispensed through the supply nozzle 510 over the substrate 202 while it is spun. After the developer 210 is dispensed onto the resist 206 at the center of the substrate 202, it flows to other parts of the resist 206 due to a centrifugal force generated by the spin. The system 500 further includes a cup 512 and a drain (or exhaust) 514. The cup 512 is configured around the substrate stage 502 to effectively catch the developer 210 (and the resist portions 206A dissolved therein) spun off from the substrate 202 during the developing process. In some embodiments, the cup 512 is designed to have a cylindrical structure. The cup 512 is integrated with the drain 514 such that the liquid received from the cup 512 is sent out through the drain 514 for further processing.

In the present embodiment, the developer 210 is obtained by real-time mixing two solutions, a first solution 210A and a second solution 210B, in the mixer 506. In an embodiment, the first solution 210A contains a developing chemical (e.g., TMAH or nBA) at a first concentration, the second solution 210B contains the developing chemical at a second concentration that is lower than the first concentration, and the developer 210 contains the developing chemical in a range from about the second concentration to about the first concentration, flexibly adjusted. In a further embodiment, the second solution 210B is free of the developing chemical and the developer 210 contains the developing chemical in a range from about 0.0% to about the first concentration, flexibly adjusted. For example, the first solution 210A may contain TMAH at 2.38%, the second solution 210B may contain deionized water (DIW) free of TMAH, and the developer 210 may contain TMAH in a range from about 0.0% to about 2.38%, flexibly adjusted, as will be discussed below.

Figure 5C:
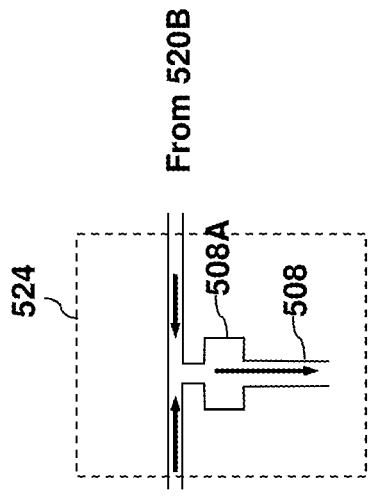
FIGS. 5B and 5C are schematic views of a part of the lithography developing apparatus of FIG. 5A, in accordance with some embodiments.
Figure 5B:
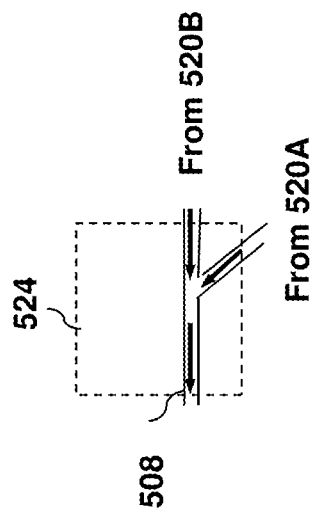

Still referring to FIG. 5A, the mixer 506 includes a first container 516A which stores the first solution 210A, and a second container 516B which stores the second solution 210B. The mixer 506 further includes pumping mechanisms (such as pressure pumps or pressurized gases) 518A and 518B to force the solutions 210A and 210B into supply pipes 520A and 520B, respectively. The mixer 506 further includes control units 522A and 522B coupled to the supply pipes 520A and 520B, respectively. The supply pipe 508 is coupled to the supply pipes 520A and 520B at the downstream of the control units 522A and 522B for receiving the solutions 210A and 210B, respectively. The control unit 522A is configured to control a flow rate 523A of the solution 210A going into the supply pipe 508. The control unit 522B is configured to control a flow rate 523B of the solution 210B going into the supply pipe 508. One or both of the control units 522A and 522B are configured to provide at least three levels of flow rate control: a minimum flow rate, a maximum flow rate, and an intermediate flow rate that is less than the maximum flow rate and greater than the minimum flow rate. In some embodiments, the control units 522A and 522B may be integrated with the pumping mechanisms 518A and 518B respectively. The two solutions, 210A and 210B, mix in the supply pipe 508 in a section proximal to the supply pipes 520A and 520B (e.g., in a section enclosed by a dotted box 524) to form the developer 210. The supply pipes 520A, 520B, and 508 may form a "T-shaped" connection as shown in FIG. 5A. Alternatively, the supply pipes 520A, 520B, and 508 may form a "Y-shaped" connection as shown in FIG. 5B. In a further embodiment as shown in FIG. 5C, the supply pipe 508 includes a proximal section 508A (closer to the supply pipes 520A and 520B) that is larger in diameter than a distal section of the supply pipe 508 (further away from the supply pipes 520A and 520B, such as near the supply nozzle 510). The section 508A may serve as a small tank that temporarily stores the solutions 210A and 210B so that they mix uniformly before being dispensed over the resist 206.

Figure 5D:
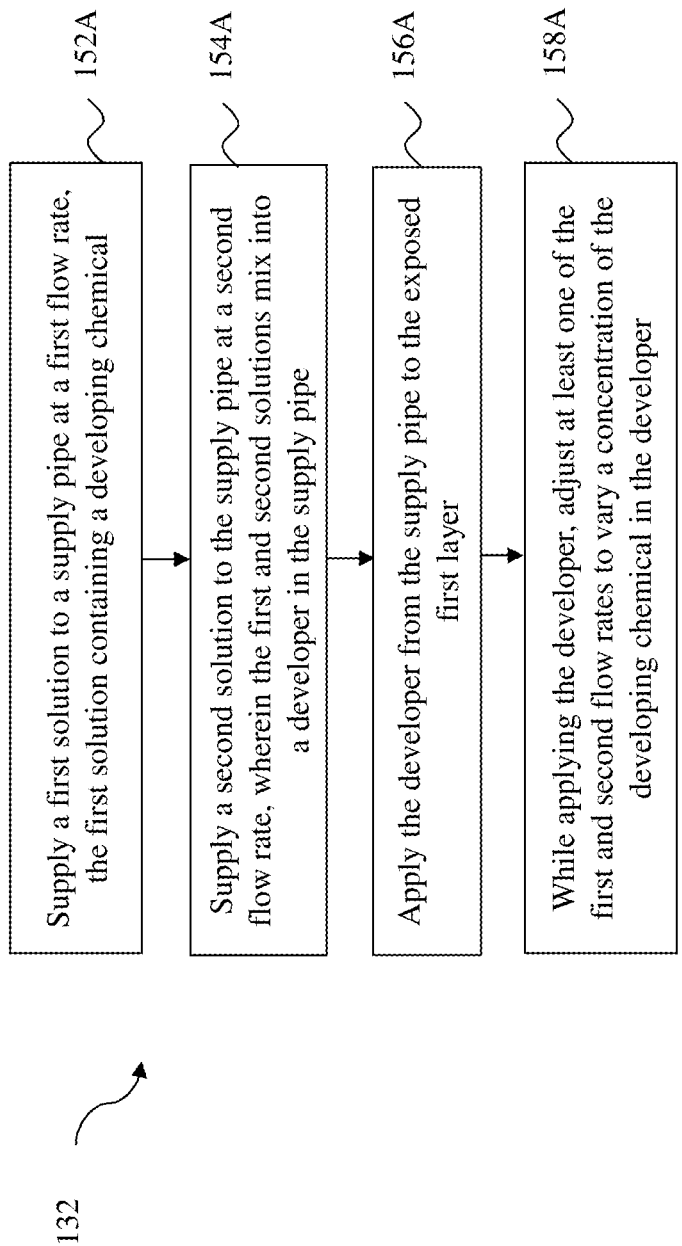
FIG. 5D illustrates a flow chart of a flexible developer concentration adjustment method, according to various aspects of the present disclosure.

With the mixer 506, the developer 210's concentration can be flexibly adjusted during the developing process. In an embodiment, the control units 522A and 522B are configured to control the flow rates of the solutions 210A and 210B according to a process recipe so as to produce a desired developer concentration profile as a function of time, such as illustrated in FIGS. 4A and 4B. An embodiment of the step 132 (also referred to as the method 132) is shown in FIG. 5D, which is briefly described below in conjunction with the sub-system 500. The method 132 includes an operation 152A which supplies a first solution (e.g., solution 210A) to a supply pipe (e.g., supply pipe 508) at a first flow rate (e.g., flow rate 523A). The method 132 further includes an operation 154A which supplies a second solution (e.g., solution 210B) to the supply pipe at a second flow rate (e.g., flow rate 523B). The first and second solutions are supplied to the supply pipe simultaneously and mix into a developer (e.g., developer 210) in the supply pipe. The method 132 further includes an operation 156A which applies the developer from the supply pipe to a target (e.g., the exposed resist 206). The method 132 further includes an operation 158A which adjusts one or both of the first and second flow rates to vary a concentration of a developing chemical in the developer.

In an embodiment, the first solution 210A is a positive tone developer, such as an aqueous solution containing 2.38% TMAH; and the second solution 210B is deionized water (DIW). To further this embodiment, the first and second solutions, 210A and 210B, may be flexibly mixed in the mixer 506 to form the developer 210 so as to have a TMAH concentration ranging from about 0.0% to about 2.38%. In another embodiment, the first solution 210A is a negative tone developer, such as a solution containing 95% nBA; and the second solution 210B is an organic solvent such as the solvent OK73 (containing 70% by weight Propylene glycol monomethylether (PGME) and 30% by weight Propylene glycol monomethylether acetate (PG-MEA)). To further this embodiment, the first and second solutions, 210A and 210B, may be flexibly mixed in the mixer 506 to form the developer 210 so as to have an nBA concentration ranging from about 90% to about 95%.

Referring back to FIG. 3, after the resist 206 has been developed, the operation 108 rinses the pattern 206B with the rinse solution 212 (FIG. 2E) in the step 134. In an embodiment, the rinse solution 212 contains water, such as DIW. In an alternative embodiment, the rinse solution may contain a surfactant dissolved in water. The rinse solution 212 is used to remove or displace residual developer 210 (and any dissolved resist 206A therein) from the device 200. In an embodiment, the rinse solution 212 is dispensed through a rinse supply nozzle different from the supply nozzle that dispenses the developer 210. In an alternative embodiment, with the system 500 shown in FIG. 5A, the rinse solution 212 may be dispensed through the same nozzle 510 that dispenses the developer 210. For example, the control unit 522A may shut off the flow of the first solution 210A that contains the developing chemical, and only the second solution 210B, which comprises DIW, is sent to the supply nozzle 510. In this way, the system 500 can be used for multiple developing steps (e.g., the steps 132 and 134), simplifying the operations and reducing system costs.

Still referring to FIG. 3, after the pattern 206B has been rinsed, the operation 108 treats the pattern 206B with one or more treatment chemicals to reduce pattern collapse and pattern deformities, such as line edge roughness and line width roughness. In the present embodiment, the operation 108 treats the pattern 206B with two treatment chemicals, the first treatment chemical 214 (FIG. 2F) in the step 136 and the second treatment chemical 216 (FIG. 2G) in the step 138. Person having ordinary skill in the art should recognize that the operation 108 may apply one treatment chemical or more than two treatment chemicals in various embodiments. The steps 136 and 138 are collectively discussed below.

In the present embodiment, the treatment chemicals 214 and 216 include different compositions. Each of the treatment chemicals 214 and 216 includes a surfactant. For example, the surfactant may include an aqueous solution containing a polyethylene glycol-based or acetylene glycol-based surfactant. As another example, each of the treatment chemicals 214 and 216 includes one or more surfactant solutions selected from the FIRM™ (Finishing up by Improved Rinse Material) family of surfactants (e.g., FIRM™-A, FIRM™-B, FIRM™-C, FIRM™-D, FIRM™ Extreme 10, etc.) co-developed by Tokyo Electron Limited (TEL) and Clariant (Japan) KK (Bunkyo-Ku, Tokyo, Japan) (a subsidiary of Swiss manufacturer Clariant).

Figure 6:
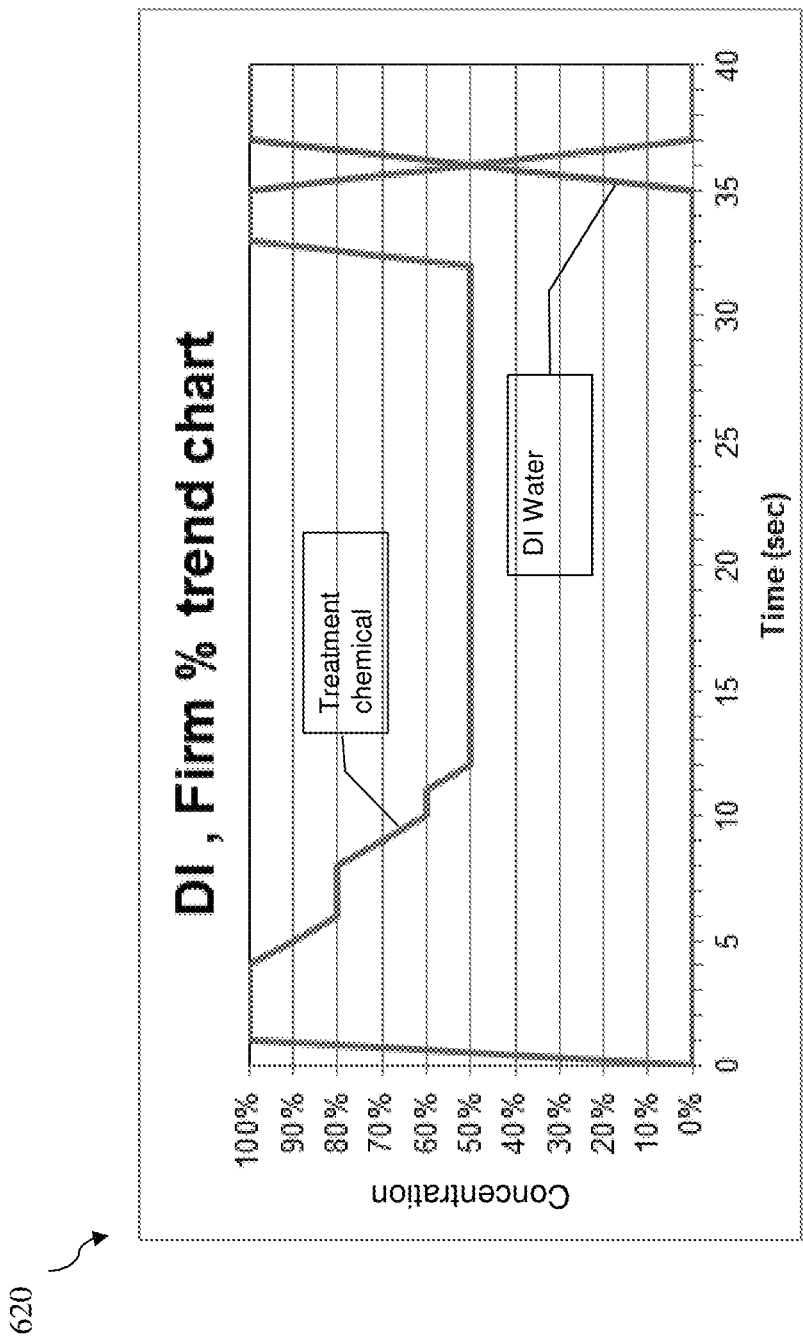
FIG. 6 shows a graph of a flexible solution adjustment in a resist treatment process, constructed according to aspects of the present disclosure in one or more embodiments.

In an embodiment, the treatment chemicals 214 and 216 each undergo a respective surfactant concentration adjustment process before being applied to the resist pattern 206B. The adjustment process is substantially similar to what has been discussed with respect to the step 132. Hence, it is only briefly described below. In an embodiment, the treatment chemical (214 or 216) may be applied in multiple stages. Within each stage, the surfactant concentration in the treatment chemical remains substantially constant. From one stage to a subsequent stage, the surfactant concentration in the treatment chemical either increases or decreases. In one particular embodiment, the step 136 (or 138) starts with a lower surfactant concentration in the treatment chemical 214 (or 216). After a first duration, the surfactant concentration in the treatment chemical 214 (or 216) increases and the resist pattern 206B is rinsed for a second duration. Thereafter, additional treatment stages may follow. In another embodiment as shown in FIG. 6, the step 136 (or 138) starts with a higher surfactant concentration in the treatment chemical 214 (or 216) which reaches about 100% in less than 2 seconds. After a first duration which is about 3 to 4 seconds, the surfactant concentration in the treatment chemical 214 (or 216) decreases in a linear step curve until it reaches a user-specified concentration level, which is about 50% in the illustrated example. The linear step curve includes one or more steps. In the illustrated example, there are two steps: a 2-second duration at about 80% and a 1-second duration at about 60%. The surfactant concentration remains at the user-specified concentration level for the majority of the treatment cycle, and increases to the full concentration level (near 100%) at the end of the treatment (at about the 33 second). After a short treatment with the high concentration of the surfactant, the treatment chemical is switched off and the DI water is switched on. Various other examples of the flexible adjustment process may be implemented for each of the steps 136 and 138.

In an embodiment, the developing system 500 includes a sub-system 525 (FIG. 7A) which supplies the treatment chemical 214 using a flexible adjustment scheme, according to various aspects of the present disclosure. In another embodiment, the developing system 500 includes a sub-system 545 (FIG. 8A) which supplies the treatment chemical 216 using a flexible adjustment scheme, according to various aspects of the present disclosure. The sub-systems 525 and 545 are structurally similar to the sub-system 505 (FIG. 5A). Hence, they are only briefly described below.

Figure 7A:
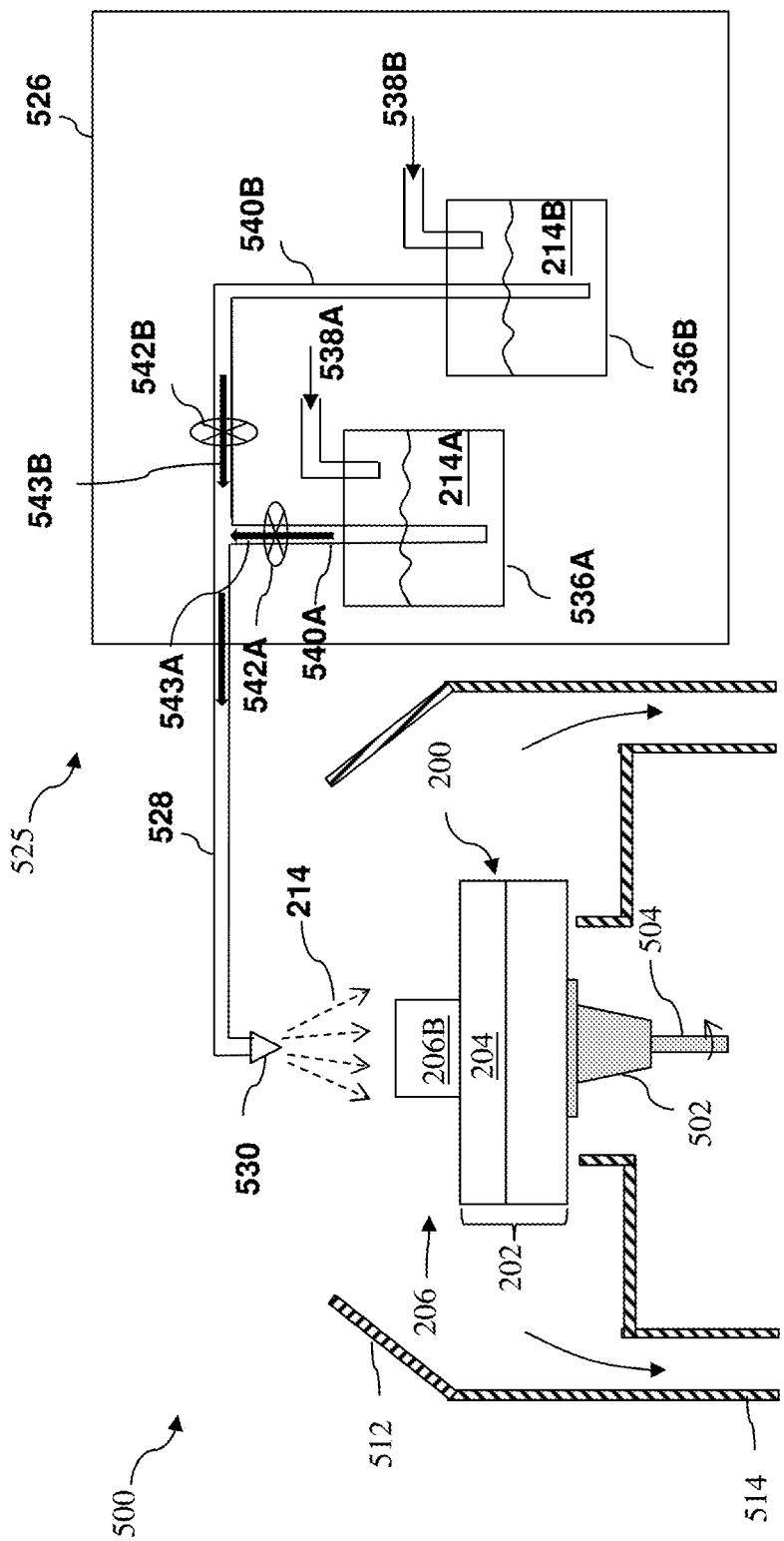
FIG. 7A is a schematic view of a pattern treatment apparatus constructed according to aspects of the present disclosure in one or more embodiments.

Referring to FIG. 7A, the sub-system 525 includes a mixer 526, a supply pipe 528, and a supply nozzle 530 coupled together. The mixer 526 includes a container 536A storing a solution 214A, and a container 536B storing a solution 214B. In an embodiment, the solution 214A contains a surfactant, and the solution 214B is DIW. The mixer 526 further includes pumping mechanisms 538A and 538B to force the solutions 214A and 214B into supply pipes 540A and 540B, respectively. The mixer 526 further includes control units 542A and 542B coupled to the supply pipes 540A and 540B, respectively. The supply pipe 528 is coupled to the supply pipes 540A and 540B at the downstream of the control units 542A and 542B for receiving the solutions 214A and 214B, respectively. The control unit 542A determines a flow rate 543A of the solution 214A going into the supply pipe 528. The control unit 542B determines a flow rate 543B of the solution 214B going into the supply pipe 528. The solutions 214A and 214B mix in the supply pipe 528 to form the treatment chemical 214 which is dispensed through the supply nozzle 530 onto the resist pattern 206B.

Figure 7B:
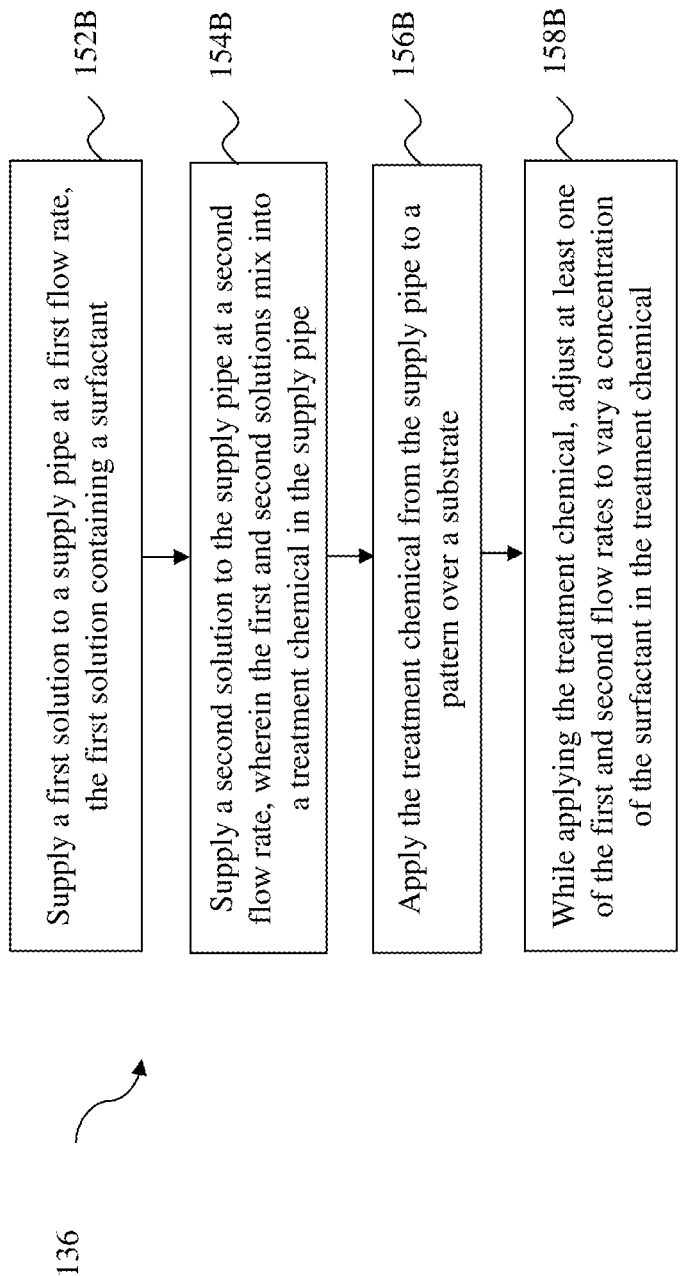
FIG. 7B illustrates a flow chart of a flexible treatment chemical adjustment method using the apparatus of FIG. 7A, according to various aspects of the present disclosure.

FIG. 7B shows an embodiment of the step 136 implemented with the system 500 shown in FIG. 7A. Referring to FIG. 7B, the step 136 includes an operation 152B which supplies the solution 214A to the supply pipe 528 at the flow rate 543A. The step 136 further includes an operation 154B which supplies the solution 214B to the supply pipe 528 at the flow rate 543B. The solutions 214A and 214B are supplied to the supply pipe 528 simultaneously and mix into the treatment chemical 214 in the supply pipe 528. The step 136 further includes an operation 156B which applies the treatment chemical 214 from the supply pipe to the resist pattern 206B. The step 136 further includes an operation 158B which adjusts one or both of the flow rates, 543A and 543B, to vary a concentration of a surfactant in the treatment chemical 214.

Figure 8A:
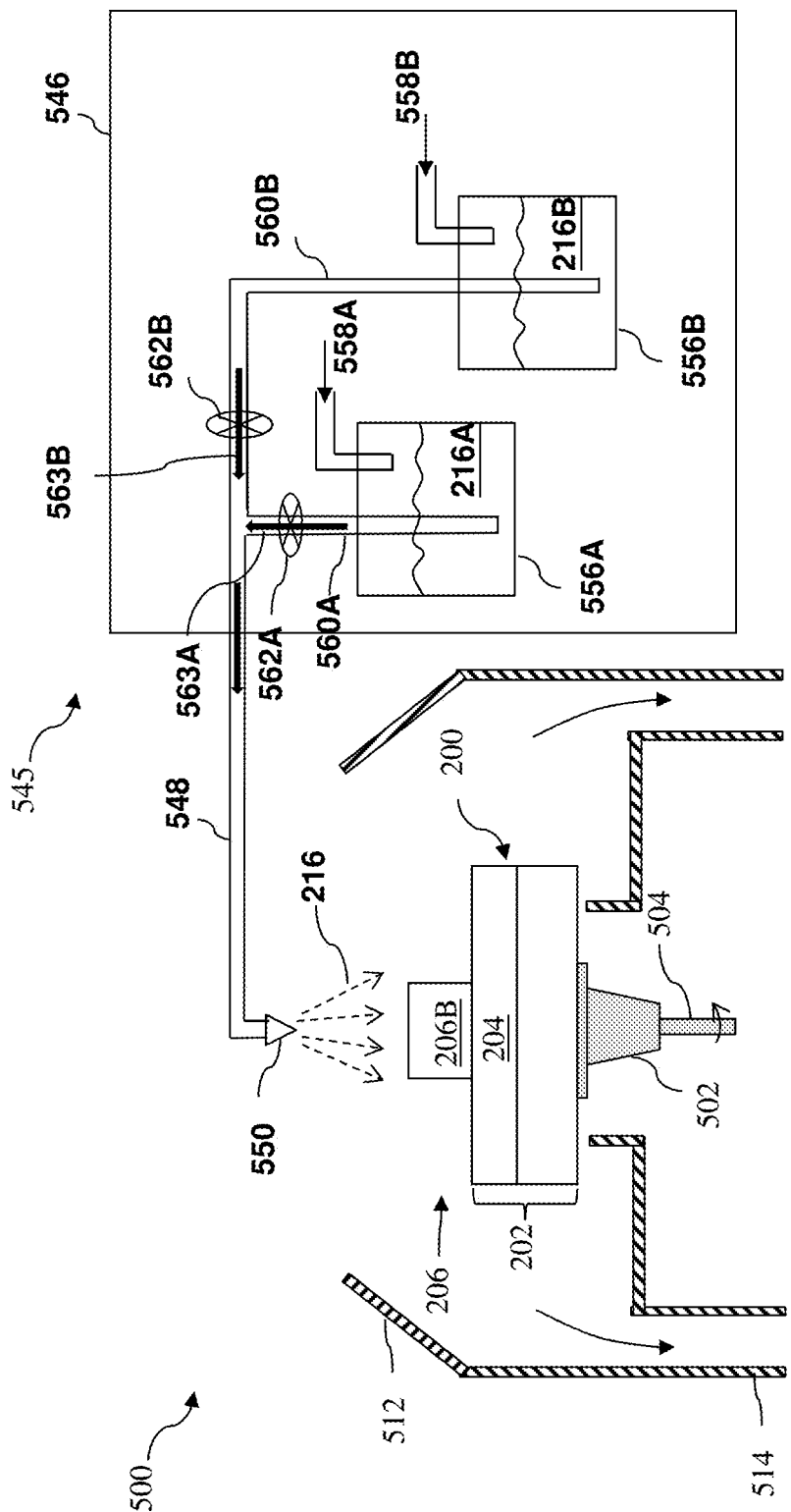
FIG. 8A is a schematic view of another pattern treatment apparatus constructed according to aspects of the present disclosure in one or more embodiments.

Referring to FIG. 8A, the sub-system 545 includes a mixer 546, a supply pipe 548, and a supply nozzle 550 coupled together. The mixer 546 includes a container 556A storing a solution 216A, and a container 556B storing a solution 216B. In an embodiment, the solution 216A contains a surfactant, and the solution 216B is DIW. The solution 216A may have a different composition than the solution 214A (FIG. 7A). The mixer 546 further includes pumping mechanisms 558A and 558B to force the solutions 216A and 216B into supply pipes 560A and 560B, respectively. The mixer 546 further includes control units 562A and 562B coupled to the supply pipes 560A and 560B, respectively. The supply pipe 548 is coupled to the supply pipes 560A and 560B at the downstream of the control units 562A and 562B for receiving the solutions 216A and 216B, respectively. The control unit 562A determines a flow rate 563A of the solution 216A going into the supply pipe 548. The control unit 562B determines a flow rate 563B of the solution 216B going into the supply pipe 548. The solutions 216A and 216B mix in the supply pipe 548 to form the treatment chemical 216 which is dispensed through the supply nozzle 550 onto the resist pattern 206B.

Figure 8B:
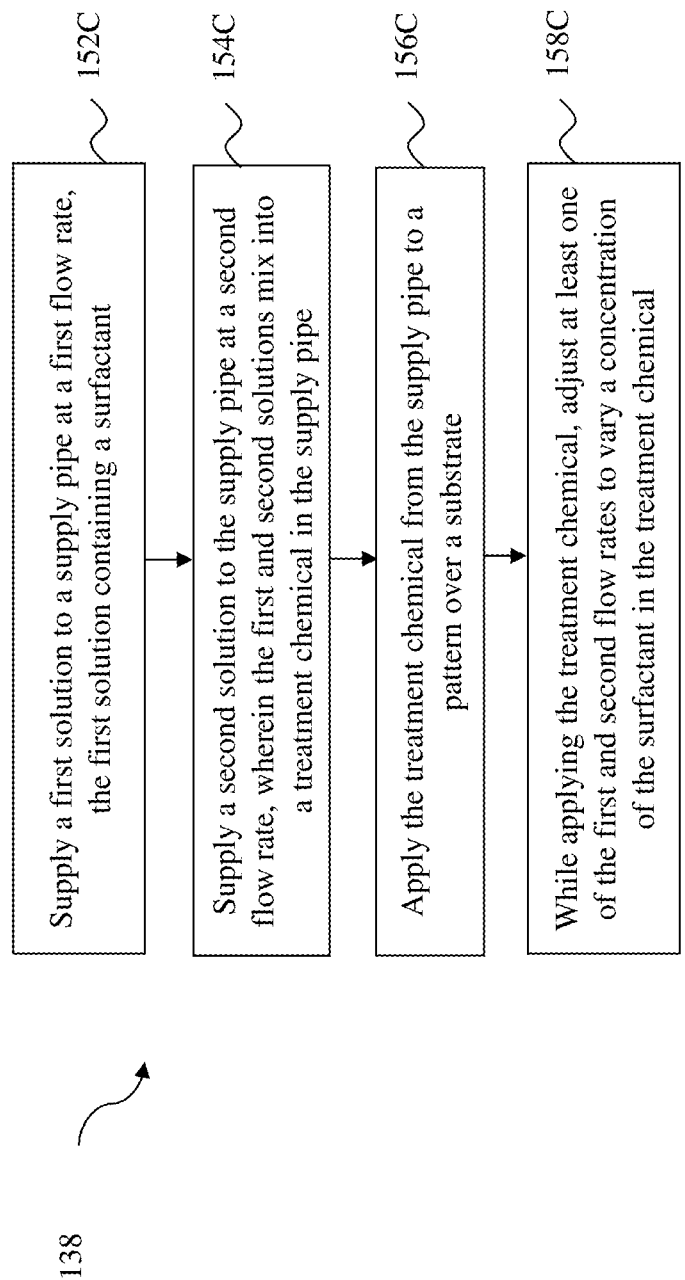
FIG. 8B illustrates a flow chart of a flexible treatment chemical adjustment method using the apparatus of FIG. 8A, according to various aspects of the present disclosure.

FIG. 8B shows an embodiment of the step 138 implemented with the system 500 shown in FIG. 8A. Referring to FIG. 8B, the step 136 includes an operation 152C which supplies the solution 216A to the supply pipe 548 at the flow rate 563A. The step 138 further includes an operation 154C which supplies the solution 216B to the supply pipe 548 at the flow rate 563B. The solutions 216A and 216B are supplied to the supply pipe 548 simultaneously and mix into the treatment chemical 216 in the supply pipe 548. The step 138 further includes an operation 156C which applies the treatment chemical 216 from the supply pipe 548 to the resist pattern 206B. The step 138 further includes an operation 158C which adjusts one or both of the flow rates, 563A and 563B, to vary a concentration of a surfactant in the treatment chemical 216.

Figure 9:
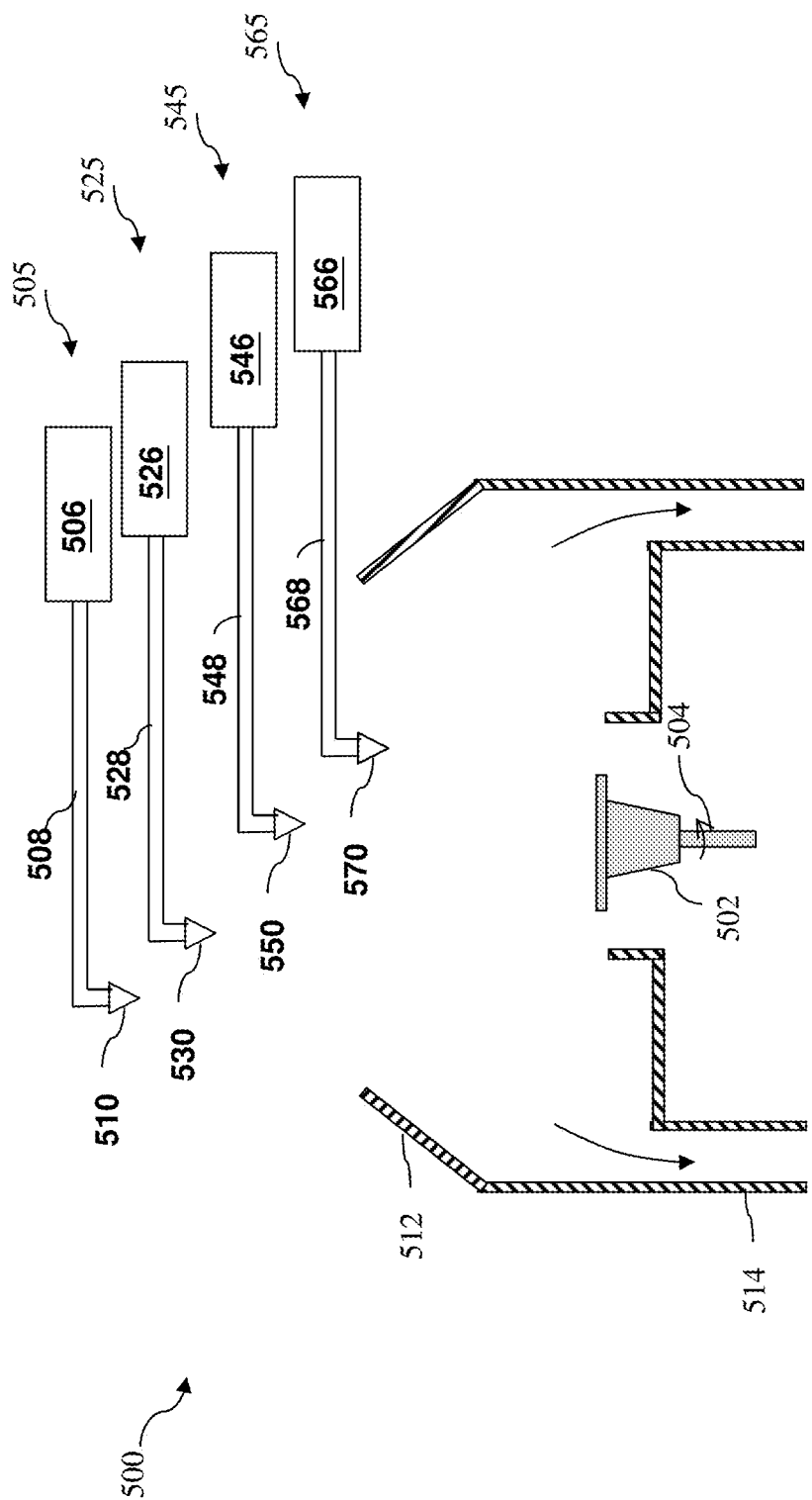
FIG. 9 is a schematic view of a lithography developing system constructed according to aspects of the present disclosure in one or more embodiments.

FIG. 9 shows an embodiment of the developing system 500. Referring to FIG. 9, the system 500 includes the sub-systems 505, 525, and 545 which have been discussed with reference to FIGS. 5A, 7A, and 8A respectively. The system 500 further includes a sub-system 565 which is configured to supply DIW from a storage unit 566 through a supply pipe 568 to a supply nozzle 570. In an embodiment, the sub-system 565 is used during the rinsing operation in the step 134 (FIG. 3). In various embodiments, each of the supply nozzles 510, 530, 550, and 570 is independently movable and can be positioned directly above a wafer (not shown) secured on the substrate stage 502 during the various developing operations discussed above.

Referring to FIG. 1, after the resist pattern 206B has been developed. The method 100 proceeds to operation 110 to etch the substrate 202 using the resist pattern 206B as an etch mask, thereby transferring the pattern to the substrate 202 (FIG. 2I). In an embodiment, the patterning layer 204 is a hard mask layer. To further this embodiment, the pattern is first transferred from the resist pattern 206B to the hard mask layer 204, then to other layers of the substrate 202. For example, the hard mask layer 204 may be etched using a dry (plasma) etching, a wet etching, and/or other etching methods. The resist pattern 206B may be partially or completely consumed during the etching of the hard mask layer 204. In an embodiment, any remaining portion of the resist pattern 206B may be stripped off, leaving a patterned hard mask layer 204 over the substrate 202, as illustrated in FIG. 2I.

Although not shown in FIG. 1, the method 100 may proceed to forming a final pattern or an IC device on the substrate 202. In a non-limiting example, the substrate 202 is a semiconductor substrate and the method 100 proceeds to forming fin field effect transistor (FinFET) structures. In this embodiment, operation 110 forms a plurality of active fins in the semiconductor substrate 202. The active fins have uniform CD, thanks to the extreme low CDU of the resist pattern 206B.

Although not intended to be limiting, one or more embodiments of the present disclosure provide many benefits to lithography processes and the ICs thereby produced. For example, embodiments of the present disclosure are capable of producing a developer (or a treatment chemical) with its concentration varied as a function of time during the developing (or treatment) process. In a particular embodiment, the developer (or the treatment chemical) may begin with a lower concentration and gradually increases its concentration as it is distributed over an entire area of a wafer. This greatly improves critical dimension uniformity across the entire area of the wafer. In addition, embodiments of the present disclosure enable flexible lithography system designs and reduce system costs.

In one exemplary aspect, the present disclosure is directed to a method for lithography patterning. The method includes forming a first layer over a substrate, the first layer being radiation-sensitive. The method further includes exposing the first layer to a radiation. The method further includes applying a developer to the exposed first layer, resulting in a pattern over the substrate, wherein the developer includes a developing chemical and a concentration of the developing chemical in the developer is a function of time during the applying of the developer.

In another exemplary aspect, the present disclosure is directed to a method for lithography patterning. The method includes providing a substrate, and forming a first layer over the substrate, the first layer being radiation-sensitive. The method further includes exposing the first layer to a radiation. The method further includes applying a developer onto the exposed first layer to result in a pattern over the substrate, wherein the developer includes a developing chemical. During the applying of the developer, the method further includes adjusting a concentration of the developing chemical in the developer.

In another exemplary aspect, the present disclosure is directed to a method for lithography patterning. The method includes forming a first layer over a substrate, the first layer being radiation-sensitive; and exposing the first layer to a radiation. The method further includes applying a first developer to the exposed first layer, wherein the first developer includes a first chemical at a first concentration. After the applying of the first developer, the method further includes applying a second developer to the exposed first layer, wherein the second developer includes the first chemical at a second concentration that is different from the first concentration. In an embodiment, the applying of the first developer includes dispensing the first developer to the exposed first layer through a supply nozzle; and the applying of the second developer includes dispensing the second developer to the exposed first layer through the supply nozzle. In a further embodiment, after the applying of the first and second developers, the method further includes applying a third developer to the exposed first layer, wherein the third developer includes the first chemical at a third concentration and is dispensed to the exposed first layer through the supply nozzle.

In another exemplary aspect, the present disclosure is directed to a method for lithography patterning. The method includes forming a first layer over a substrate, the first layer being radiation-sensitive; exposing the first layer to a radiation; developing the exposed first layer in a developer, resulting in a developed first layer; and rinsing the developed first layer with a rinse solution. After the rinsing of the developed first layer, the method further includes treating the developed first layer with a first chemical, wherein the first chemical includes a first surfactant and a concentration of the first surfactant in the first chemical is a function of time during the treating of the developed first layer with the first chemical. In an embodiment, after the treating of the developed first layer with the first chemical, the method further includes treating the developed first layer with a second chemical. The second chemical includes a second surfactant. A concentration of the second surfactant in the second chemical is a function of time during the treating of the developed first layer with the second chemical. The first and second surfactants have different compositions. In an embodiment, the treating of the developed first layer with the first chemical includes supplying deionized water (DIW) into a supply pipe at a first flow rate; supplying a solution containing the first surfactant into the supply pipe at a second flow rate, wherein the DIW and the solution are mixed in the supply pipe to form the first chemical; dispensing the first chemical onto the developed first layer; and adjusting at least one of: the first flow rate and the second flow rate so as to vary the concentration of the first surfactant in the first chemical.

In another exemplary aspect, the present disclosure is directed to a system for lithography patterning. The system includes a first supply pipe for supplying a first solution, a second supply pipe for supplying a second solution, and a third supply pipe coupled to the first and second supply pipes for receiving the first and second solutions respectively and mixing the first and second solutions into a mixture. The system further includes a substrate stage for holding a substrate and a supply nozzle coupled to the third supply pipe for dispensing the mixture to the substrate. The system further includes a first control unit coupled to the first supply pipe and configured to control a flow rate of the first solution going to the third supply pipe. The system further includes a second control unit coupled to the second supply pipe and configured to control a flow rate of the second solution going to the third supply pipe.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A system for lithography patterning, comprising:
   a first supply pipe for supplying a first solution;
   a second supply pipe for supplying a second solution;
   a third supply pipe coupled to the first and second supply pipes for receiving the first and second solutions respectively and mixing the first and second solutions into a mixture, wherein a section of the third supply pipe that is proximal to the first and second supply pipes is larger in diameter than another section of the third supply pipe that is distal to the first and second supply pipes;
   a substrate stage for holding a substrate;
   a supply nozzle coupled to the third supply pipe for dispensing the mixture to the substrate;
   a first control unit coupled to the first supply pipe and configured to control a flow rate of the first solution going to the third supply pipe; and
   a second control unit coupled to the second supply pipe and configured to control a flow rate of the second solution going to the third supply pipe.

2. The system of claim 1, wherein the first solution contains a developing chemical at a first concentration and the second solution contains the developing chemical at a second concentration that is lower than the first concentration.

3. The system of claim 2, wherein the developing chemical is tetramethylammonium hydroxide (TMAH).

4. The system of claim 2, wherein the developing chemical is n-Butyl Acetate (nBA).

5. The system of claim 1, wherein at least one of the first and second control units is configured to provide at least three levels of flow rate control: a minimum flow rate, a maximum flow rate, and an intermediate flow rate that is less than the maximum flow rate and greater than the minimum flow rate.

6. The system of claim 1, wherein the first and second control units are configured to adjust the flow rates of the first and second solutions according to a process recipe so as to vary a chemical concentration in the mixture.

7. The system of claim 1, wherein the supply nozzle is also operable for dispensing a rinse solution that contains a surfactant.

8. The system of claim 1, wherein the third supply pipe couples to the first and second supply pipe at a junction, and wherein at the junction the first solution in the first supply pipe flows in a direction substantially perpendicular to that of the second solution in the second supply pipe.

9. The system of claim 1, wherein the third supply pipe couples to the first and second supply pipe at a junction, and wherein at the junction the first solution in the first supply pipe flows in a direction substantially opposite to that of the second solution in the second supply pipe.

10. A system for a dispensing operation, comprising:
    a first pipe coupled to a first container that stores a first solution;
    a second pipe coupled to a second container that stores a second solution;

a third pipe, wherein the first and second pipes merge into an elongated portion of the third pipe, wherein the first and second solutions mix inside the elongated portion, thereby forming a mixture;

a substrate stage for holding a substrate, wherein the substrate receives the mixture from the third pipe; and at least one control unit coupled to one of the first and second pipes to control a flow rate going into the third pipe, wherein the at least one control unit is operable to control the flow rate such as to vary a chemical concentration in the mixture real-time during the dispensing operation.

11. The system of claim 10, wherein the elongated portion has a first section proximal to the first and second pipes and a second section distal to the first and second pipes, and wherein the first section has a larger diameter than the second section.

12. The system of claim 10, further comprising:
a first pumping mechanism coupled to the first container so as to force the first solution to flow into the first pipe; and
a second pumping mechanism coupled to the second container so as to force the second solution to flow into the second pipe.

13. The system of claim 10, wherein the at least one control unit is operable to control the flow rate to provide a 6-stage adjustment of the chemical concentration during the dispensing operation.

14. The system of claim 10, wherein the at least one control unit is operable to linearly increase or linearly decrease the chemical concentration during the dispensing operation.

15. A System, comprising:
a substrate stage for holding a substrate;
a first nozzle movable above the substrate stage, the first nozzle is operable to dispense a developer to the substrate;
a first mixer coupled to the first nozzle;
a first fluid source in fluid communication with the first mixer for supplying a first solution;
a second fluid source in fluid communication with the first mixer for supplying a second solution, wherein the first and second solutions mix inside the first mixer to form the developer;
a first flow rate adjusting mechanism that adjusts flow rates of the first and second solutions so as to vary a chemical concentration in the developer;
a second nozzle movable above the substrate stage, the second nozzle is operable to dispense a first treatment chemical to the substrate, wherein the first treatment chemical includes a first surfactant;
a second mixer coupled to the second nozzle;
a third fluid source in fluid communication with the second mixer for supplying a third solution;
a fourth fluid source in fluid communication with the second mixer for supplying a fourth solution, wherein the third and fourth solutions mix inside the second mixer to form the first treatment chemical;
a second flow rate adjusting mechanism that adjusts flow rates of the third and fourth solutions so as to vary a chemical concentration in the first treatment chemical; and
a third nozzle operable to dispense a second treatment chemical to the substrate, wherein the second treatment chemical includes a second surfactant that is different from the first surfactant.

16. The system of claim 15, further comprising:
a third mixer coupled to the third nozzle;
a fifth fluid source in fluid communication with the third mixer for supplying a fifth solution;
a sixth fluid source in fluid communication with the third mixer for supplying a sixth solution, wherein the fifth and sixth solutions mix inside the third mixer to form the second treatment chemical; and
a third flow rate adjusting mechanism that adjusts flow rates of the fifth and sixth solutions so as to vary a chemical concentration in the second treatment chemical.

17. The system of claim 15, further comprising:
a rinsing nozzle movable above the substrate stage, the rinsing nozzle is operable to dispense a rinsing liquid to the substrate.

18. The system of claim 17, wherein the rinsing liquid is deionized water (DIW).

19. The system of claim 15, wherein the third nozzle is movable above the substrate stage.

20. The system of claim 15, wherein the first mixer includes a supply pipe that has a first section distal to the first nozzle and a second section proximal to the first nozzle, and wherein the first section has a larger diameter than the second section.

* * * * *